United States Patent
Saitou

(10) Patent No.: US 8,159,041 B2
(45) Date of Patent: Apr. 17, 2012

(54) SEMICONDUCTOR DEVICE AND MANUFACTURING METHOD THEREOF

(75) Inventor: Hiroki Saitou, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 250 days.

(21) Appl. No.: 12/707,292

(22) Filed: Feb. 17, 2010

(65) Prior Publication Data

US 2010/0207239 A1  Aug. 19, 2010

(30) Foreign Application Priority Data

Feb. 18, 2009  (JP) ................... 2009-035048

(51) Int. Cl.
*H01L 23/52* (2006.01)

(52) U.S. Cl. ........... 257/529; 257/249; 257/E23.149; 257/209; 257/665; 257/E21.592; 438/132; 438/467; 438/607

(58) Field of Classification Search ............ 257/529, 257/249, E23.149, 209, 665, E21.592, E23.129; 438/132, 467, 607

See application file for complete search history.

(56) References Cited

U.S. PATENT DOCUMENTS

| | | | | |
|---|---|---|---|---|
| 7,635,907 B2* | 12/2009 | Ueda | | 257/529 |
| 7,728,407 B2* | 6/2010 | Ueda | | 257/529 |
| 7,906,848 B2* | 3/2011 | Kumagai et al. | | 257/758 |
| 2004/0262710 A1* | 12/2004 | Ueda | | 257/529 |
| 2005/0285222 A1* | 12/2005 | Thei et al. | | 257/529 |
| 2007/0120256 A1* | 5/2007 | Chen | | 257/758 |
| 2007/0262414 A1* | 11/2007 | Ueda | | 257/529 |
| 2007/0280012 A1* | 12/2007 | Obayashi et al. | | 365/200 |
| 2008/0237787 A1* | 10/2008 | Yonezu et al. | | 257/529 |
| 2011/0267136 A1* | 11/2011 | Ueda | | 327/525 |

FOREIGN PATENT DOCUMENTS

JP  2003007821 A  *  1/2003
JP  2007-305693 A     11/2007

* cited by examiner

*Primary Examiner* — Fernando L Toledo
*Assistant Examiner* — Ankush Singal
(74) *Attorney, Agent, or Firm* — Foley & Lardner LLP

(57) ABSTRACT

A semiconductor device includes: a lower layer interconnection formed on a chip; an upper layer interconnection formed in an upper layer above the lower layer interconnection above the chip; an interconnection via formed to electrically connect the lower layer interconnection and the upper layer interconnection; a via-type electric fuse formed to electrically connect the lower layer interconnection and the upper layer interconnection. The fuse is cut through heat generation, and a sectional area of the fuse is smaller than a sectional area of the upper layer interconnection and a via diameter of the fuse is smaller than that of the interconnection via.

4 Claims, 4 Drawing Sheets

Fig. 4

|  |  | CORRECT CUT CASE | DEFECTIVE CUT CASE | DEFECTIVE CUT CASE |
|---|---|---|---|---|
| V1 | SECTIONAL AREA (nm$^2$) | 10000 | 13000 | 15000 |
| M2 | SECTIONAL AREA (nm$^2$) | 18000 | 20000 | 20000 |
| SECTIONAL AREA RATIO M2/V1 | | 1.8 | 1.5 | 1.3 |

CORRECT CUT CASE

DEFECTIVE CUT CASE

SEMICONDUCTOR DEVICE AND MANUFACTURING METHOD THEREOF

INCORPORATION BY REFERENCE

This patent application claims a priority on convention based on Japanese Patent Application No. 2009-035048. The disclosure thereof is incorporated herein by reference.

TECHNICAL FIELD

The present invention relates to a semiconductor device and particularly relates to a semiconductor device having an eFuse (electric fuse).

BACKGROUND ART

The dimensions of via diameters are generally same on a same chip irrespective of locations of the vias. Accordingly, when the via diameter is large in the entire chip, an eFuse is more susceptible to initial cutting defect and re-coupling. When the via diameter is large, there is a possibility that a resistance balance between a metal interconnection and a via can not be taken so that stress at the time of cutting is not applied to the bottom of the via but to on the metal interconnection. If the cutting stress is applied to any positions other than the via bottom, the cross sectional shape at the time of cutting becomes complicated to cause the initial cutting defect and re-coupling defect.

On the contrary, if the via diameter is small in the entire chip, the via is not sufficiently filled and there is a risk that quality degradation such as connection failure may occur.

In conjunction with the above description, Japanese Patent Publication (JP 2007-305693A: Patent Literature 1) discloses a semiconductor device. In this technique, the eFuse includes an upper layer interconnection, a via connected to the upper interconnection and a lower layer interconnection connected to the via. An outflow portion is formed to allow an outflow of a conductor from the upper layer interconnection to the outside and a gap portion is formed between the lower layer interconnection and the via.

In an existing semiconductor device using an eFuse (electric fuse), the via diameter is sometimes made large and the interconnection is made thin. In such a case, if a resistance balance cannot be taken, there is a possibility that a initial cutting defect or re-coupling defect occurs.

It could be considered that it is effective to make the via diameter small or make the interconnection thick, in order to keep the resistance balance. However, in the former case, via quality would be degraded if the via diameter is uniformly reduced in the entire chip. Also, in the latter case, if the interconnection is made thick, it would be difficult to realize a layout because an area for interconnections increases.

SUMMARY OF THE INVENTION

In an aspect of the present invention, a semiconductor device includes: a lower layer interconnection formed on a chip; an upper layer interconnection formed in an upper layer above the lower layer interconnection above the chip; an interconnection via formed to electrically connect the lower layer interconnection and the upper layer interconnection; a via-type electric fuse formed to electrically connect the lower layer interconnection and the upper layer interconnection. The fuse is cut through heat generation, and a sectional area of the fuse is smaller than a sectional area of the upper layer interconnection and a via diameter of the fuse is smaller than that of the interconnection via.

As described above, the dimensions of a via and an upper layer interconnection are changed to optimize a sectional area ratio, whereby making it possible to reduce the initial cutting defect and the re-coupling defect in via-type eFuse (i.e. via-type electric fuse) and secure a via quality and a product yield in an entire chip.

BRIEF DESCRIPTION OF THE DRAWINGS

The above and other objects, advantages and features of the present invention will be more apparent from the following description of certain embodiments taken in conjunction with the accompanying drawings, in which:

FIG. 4 shows experimental values obtained in ordinary and unordinary states of cutting off the eFuse.

DESCRIPTION OF PREFERRED EMBODIMENTS

Hereinafter, a semiconductor device according to the present invention will be described in detail with reference to the attached drawings.

Figure 1:
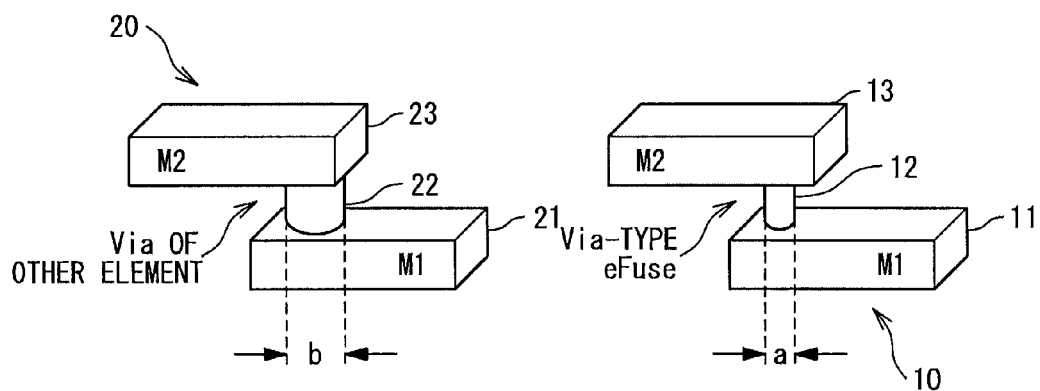
FIG. 1 is a conceptual diagram showing a characteristic portion of a semiconductor device according to the present invention.

FIG. 1 shows the semiconductor device according to an embodiment of the present invention. The semiconductor device in the present embodiment includes an eFuse (electric fuse) section 10 and another element 20. The eFuse section 10 includes a first interconnection M1 11, a via 12 and a second interconnection M2 13. The other element 20 includes a first interconnection M1 21, a via 22 and a second interconnection M2 23.

The first interconnection 11 and the second interconnection 13 are formed in layers different from each other. The first interconnection 21 and the second interconnection 23 are also formed in layers different from each other. Here, each of the first interconnection 11 and the first interconnection 21 is a lower layer interconnection arranged above a chip. Also, each of the second interconnection 13 and the second interconnection 23 is an upper layer interconnection arranged in a layer above the lower layer interconnection. It should be noted that the first interconnection 11 and the first interconnection 21 may also be arranged in a same interconnection layer, and the second interconnection 13 and the second interconnection 23 may also be arranged in a same interconnection layer.

Each of the first interconnection 11, the second interconnection 12, the first interconnection 21 and the second interconnection 23 is made of a metal interconnection. As an example of the first interconnection 11, the second interconnection 12, the first interconnection 21 and the second interconnection 23 are assumed a metal mask, a metal core of a metal substrate (i.e. metal-based print substrate) and so on. In this case, aluminum, copper or the like are employed as metal material. It is assumed here that via metal used in the via 12 and the via 22 is a same kind of metal material. It should be noted, however, that the present invention is not limited to these examples.

The via 12 is a via-type eFuse (i.e. via-type electric fuse) to electrically connect the first interconnection 11 and the second interconnection 13 by an interlayer interconnection (or via interconnection) which is brought into a cut-off state by heating. The via 22 is also an ordinary interconnection via to electrically connect the first interconnection 21 and the second interconnection 23 by an interlayer interconnection. That is, both the via 12 and the via 22 are used to connect the upper layer interconnection and the lower layer interconnection.

Figure 2:
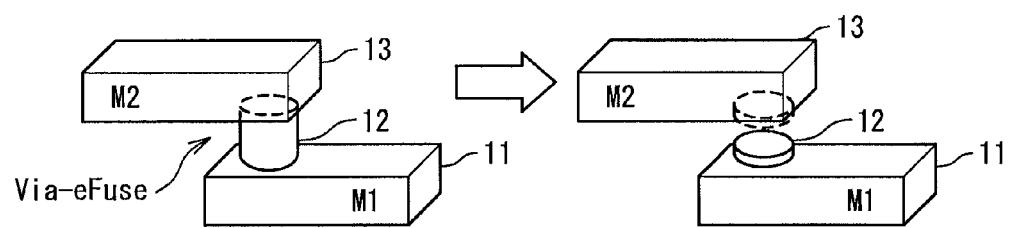
FIG. 2 is a diagram showing how to cut off an eFuse (electric fuse)

Referring to FIG. 2, a cutting operation in the eFuse section 10 will be described. The eFuse 12 is cut off through heat generation in the via 12. Here, the eFuse section 10 is designed to form a void in the via 12 in a stable manner by using volume reduction of a material such as Cu (copper) and suction of the material into a crack generated in an interlayer interconnection through heat generation in the via 12 by current flowing through the via 12.

If the eFuse section 10 is cut off, it is fixed completely while continuing to form the void above the via with thermal shrinkage, before reaching a room temperature.

The semiconductor device according to the present invention changes the eFuse section 10 from a low resistance state (before cutting off) to a high resistance state (after cutting off) and therefore serves as a device which can be used as a non-volatile memory.

Figure 3:
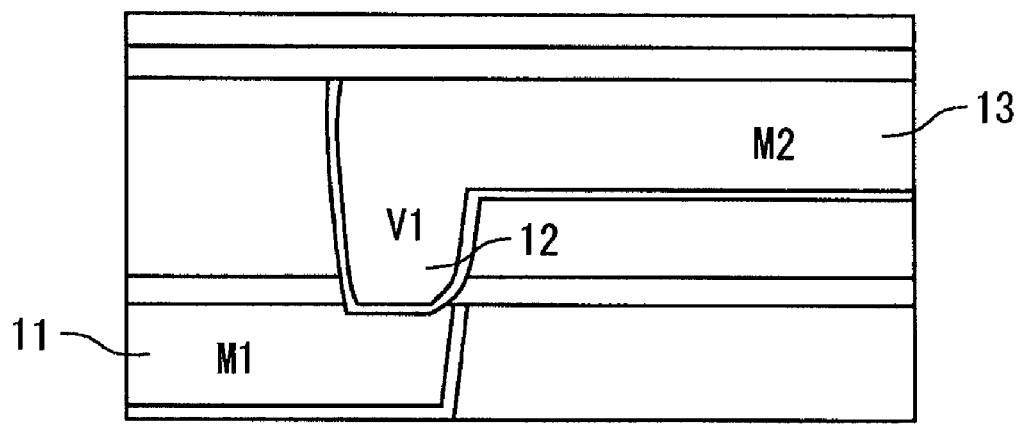
FIG. 3 shows an example of a structure of the eFuse.

Next, a case of a correct cut state of the eFuse section 10 and a case of a defective cut state of the eFuse section 10 will be described. It is assumed here that, as shown in FIG. 3, the first interconnection 11 is "M1", the via 12 is "V1" and the second interconnection 13 is "M2". It is also assumed that a current flows from the second interconnection 13 to the first interconnection 11. It should be noted that, in order to compare the correct cut case and the defective cut case in cutting off the eFuse section 10, an experiment is repeated by cutting off the eFuse sections 10 having various via diameters (or via sectional areas) under the same condition and carrying out evaluation thereof.

FIG. 4 shows experimental values of "V1" and "M2" obtained in representative experimental results of the correct cut case and the defective cut case in cutting off the eFuse section 10. The experiment is carried out by using a cut voltage "3.3 V".

1) Correct Cut Case

Experimental values are shown in the correct cut case of the via "V1" 12. It is assumed here that the sectional area of the via "V1" 12 is "10000 nm$^2$". The sectional area of the second interconnection "M2" 13 is also assumed to be "18000 nm$^2$". In this experiment, the eFuse section 10 is correctly cut off, and a sectional area ratio between the second interconnection "M2" 13 and the via "V1" 12 is "M2/V1=18000/10000=1.8".

2) Defective Cut Case 1

Experimental values are shown in the defective cut case of the via "V1" 12. It is assumed here that the sectional area of the via "V1" 12 is "13000 nm$^2$". The sectional area of the second interconnection "M2" 13 is also assumed to be "20000 nm$^2$". In this experiment, the eFuse section 10 is defectively cut off, and the sectional area ratio between the second interconnection "M2" 13 and the via "V1" 12 is "M2/V1=20000/13000≈1.5".

3) Defective Cut Case 2

Experimental values are shown in the defective cut case of the via "V1" 12. It is assumed here that the sectional area of the via "V1" 12 is "15000 nm$^2$". The sectional area of the second interconnection "M2" 13 is also assumed to be "20000 nm$^2$". In this experiment, the eFuse section 10 is defectively cut off, and the sectional area ratio between the second interconnection "M2" 13 and the via "V1" 12 is "M2/V1=20000/15000≈1.3".

It should be noted that the values of "V1" and "M2" in the above experiments are merely values based on a generalized model. The values of "V1" and "M2" are assumed to be variable depending on the generation of an application process. Also, since the cut of the eFuse section 10 involves a phenomenon of heat transfer through the interconnections M1 and M2 and guard metal, evaluation is made in the present invention by checking whether or not the eFuse section 10 maintains an eFuse characteristic even if each parameter varies within the manufacturing standard.

Figure 5A:
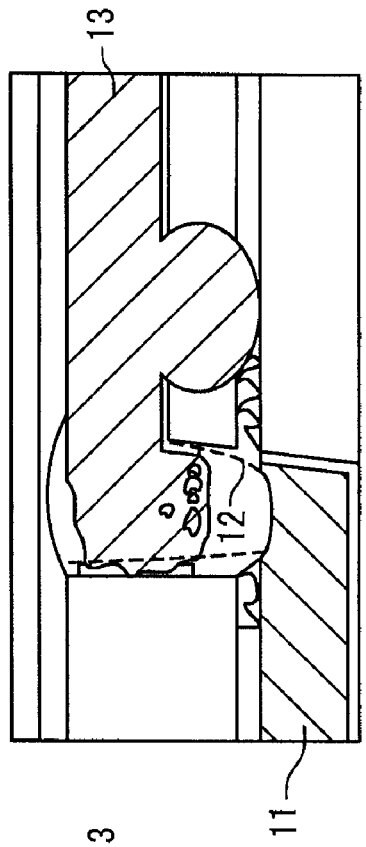
FIGS. 5A and 5B show examples of the ordinary and unordinary states in cutting off the eFuse.
Figure 5B:
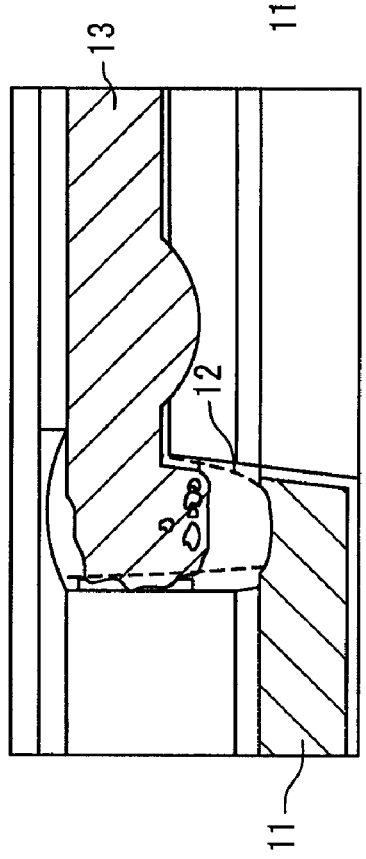

FIGS. 5A and 5B show representative experimental results in the correct cut case and the defective cut case.

The correct cut case shows that the via 12 is cut off completely as shown in FIG. 5A. A resistance balance between the second interconnection 13 and the via 12 is kept and a cutting stress is applied to a bottom of the via 12. Therefore, the second interconnection 13 does not exhibit significant thermal expansion. Here, a path between the first interconnection 11 and the second interconnection 13 is electrically cut off completely, and the eFuse section 10 can maintain the eFuse characteristic.

If the eFuse section 10 is defectively cut off, the via 12 is not cut off completely and left in a space toward the first interconnection 11 in the lower layer as fine fragments, as shown in FIG. 5B. The resistance balance between the second interconnection 13 and the via 12 is also degraded and a cutting stress is concentrated on the second interconnection 13 rather than the bottom of the via 12 to which the stress should be applied. Thus, the second interconnection 13 is increased in thickness due to thermal expansion and brought into contact with (or made to re-coupling to) the first interconnection 11 in the lower layer. That is, a path between the first interconnection 11 and the second interconnection 13 is not electrically cut off.

Here, the via "V1" 12 in the correct cut state is referred to as "VA1". Accordingly, the sectional area ratio between the interconnection "M2" and the via "VA1" is "M2/VA1=1.8". The via "V1" 12 in the defective cut state is referred to as "VB1". Accordingly, the sectional area ratio between the interconnection "M2" and the via "VB1" is "M2/VB1≈1.5". At this time, the sectional area ratio between the vias is "VA1/VB1=(M2/VB1)/(M2/VA1)=1.5/1.8≈0.8".

That is, in order to bring the eFuse section 10 into the correct cut state, it is estimated from the experiment result that the sectional area ratio between the via "VA1" 12 and the via "VB1" 12 should meet the relation "VA1/VB1≦0.8" under the condition that the sectional area ratio between the second interconnection "M2" 13 and the via "VA1" 12 is "M2/VA1≧1.8". In other words, it is estimated in the eFuse section 10 of the present embodiment that the sectional area of the via 12 in the correct cut case should be set to be equal to or less than 0.8 times the sectional area of the via 12 in the defective cut state.

From the present embodiment, it could be understood that the sectional area of the via "VA1" 12 in the correct cut case is smaller than the sectional area of the second interconnection "M2" 13 and the sectional area of the via "VB1" 12 in the defective cut state. More specifically, in order to bring a cut state into the correct state, the via "V1" 12 should have a smaller sectional area.

Here, there is a risk that the via quality is degraded if the via diameter is uniformly made small in an entire chip. Accordingly, only the sectional area of the via 12 should be made smaller. In this case, when the vias 22 in the other elements 20 are assumed to have the sectional area "V2", the sectional area ratio between the via 22 and the via 12 should meet the relation of "V2>V1".

It should be noted that sectional areas of the upper interconnection, the lower interconnection, and the via which connects these interconnections may also be equivalent from each other in the other element 20 in practice. In this case, if the sectional area of the first interconnection 21 is assumed to be "M1" in the same manner as the first interconnection 11 and the sectional area of the second interconnection 23 is assumed to be "M2" in the same manner as the second interconnection 13, the sectional area ratio among the first interconnection 21, the second interconnection 23 and the via 22 is "M1:M2:V2=1:1:1". At this time, if the sectional area ratio between the second interconnection 13 and the via 12 meets the relation "M2/V1≧1.8", the sectional area ratio between the via 22 and the via 12 naturally meets the relation "V2/V1≧1.8". It should be noted that "V2/V1≧1.8" satisfies the condition of "V2>V1".

In this case, in order to bring the eFuse section 10 into the correct cut state without changing the sectional area of the upper interconnection and the via diameter of the other element, the via 12 should be arranged so that the sectional area of the second interconnection 13 and the sectional area of the via 22 are equal to or more than 1.8 times the sectional area of the via 12.

Moreover, in order to bring the eFuse section 10 into the correct cut state by changing the sectional area of the upper layer interconnection and the via diameter of the other element, the second interconnection 23 and the via 22 should be arranged so that the sectional area of the second interconnection 23 and the sectional area of the via 22 are equal to or more than 1.8 times the sectional area of the via 12. At this time, an entire area occupied by the via 12, the second interconnection 13 and the via 22 is not larger than an entire area occupied by them without application of the present invention.

It could be understood in either case that when the eFuse section 10 is brought into the correct cut state, the sectional area of the via 12 in the eFuse section 10 needs to be smaller than the sectional area of the second interconnection 13 and the via diameter of the via 12 in the eFuse section 10 needs to be smaller than the via diameter of the via 22 in the other element 20. It should be noted that FIG. 1 shows the via diameter of the via 12 as "a" and the via diameter of the via 22 as "b". In order to bring the eFuse section 10 into the correct cut state, the via diameter of the via 12 should be designed in such a manner that the via 12 and via 22 meet the relation of "b>a". That is, in a manufacturing method of the semiconductor device according to the present invention, via holes of the via 12 and the via 22 are arranged so that the via diameter is provided to satisfy each of the above relations.

Next, a manufacturing method of the semiconductor device according to the present invention will be described.

In the method of manufacturing a semiconductor device, the lower layer interconnections 11 and 21 are formed on a semiconductor substrate. An interlayer insulating film is formed on the lower layer interconnections 11 and 21 and the substrate. First and second via holes are formed to pass through the interlayer insulating film to the lower layer interconnections 11 and 21, respectively. Upper interconnections 23 and 13 are formed on the interlayer insulating film to fill the via holes, respectively. Thus, the interconnections 23 and 11, the interconnection via 22 and the via-type electric fuse 12 are formed. Then, an interlayer insulating film is formed and subsequently a CMP process is performed.

In the manufacturing method of the semiconductor device according to the present invention, the via hole of the via 22 is arranged on a chip so as to electrically connect the second interconnection 23 and the first interconnection 21 by an interlayer interconnection. The via hole of the via 12 is also arranged on a same chip so as to electrically connect the second interconnection 13 and the first interconnection 11 by an interlayer interconnection which is cut through heat generation. At this time, the via hole of the via 22, the via hole of the via 12 and the second interconnection 23 are arranged on the same chip such that the via sectional area of the via 12 is smaller than the sectional area of the second interconnection 13 and the via diameter of the via 12 is smaller than the via diameter of the via 22.

It should be noted that the via 12 is a via-type eFuse (i.e. via-type electrical fuse). The via 22 is an ordinary interconnection via. Each of the second interconnection 13 and the second interconnection 23 is an upper layer interconnection. The first interconnections 11 and 21 are lower layer interconnections.

In the manufacturing method of the semiconductor device according to the present invention, the via hole of the via 12 and the second interconnection 13 are designed such that the sectional area of the second interconnection 13 is equal to or more than 1.8 times the sectional area of the via 12. Also, in the manufacturing method of the semiconductor device according to the present invention, the via holes of the via 22 and the via 12 and the second interconnection 13 are formed such that the sectional area of the via 22 is equal to the sectional area of the upper layer interconnection and equal to or more than 1.8 times the sectional area of the via 12.

It should be noted that in the manufacturing method of the semiconductor device according to the present invention, the via hole of the via 12 is formed such that the sectional area of the via 22 is equal to or less than 0.8 times the sectional area of the via 12 obtained when the interlayer interconnection exhibits the defective cut state.

As stated above, the present invention provides a technique to improve the yield of via-type eFuse.

In the present invention, the via diameter of a via in the eFuse section is smaller than the via diameter in the other element on the mask. For example, only the via diameter in the eFuse section is made small while keeping the via diameter in the other element and the sectional area of the upper layer interconnection. Alternatively, the sectional area ratio may also be optimized to make the via diameter of the eFuse section relatively small by changing the via diameter of the eFuse section, the via diameter of the via in the other element and the sectional area of the upper interconnection.

As such, it become possible to reduce initial cut defect and re-coupling defect in the eFuse while keeping via quality by making the via diameter in the eFuse section smaller than the via diameter of the via in the other element on a same chip.

In the case of via-type eFuse, if the resistance balance between metal interconnections and the vias is not kept, failures frequent occur. Accordingly, it is necessary to make the via diameter small for keeping its balance. However, when the via diameter is made uniformly small in an entire chip, the via quality is reduced in an area other than the eFuse. Therefore, the via diameter is changed partially to achieve improvement in the eFuse yield while keeping the conventional via quality.

According to the present invention, it is possible to increase redundancy of memories such as a DRAM and an SRAM.

The present invention is considered as being applicable to memory elements or other elements used for chip and/or device ID (or identification information).

The present invention described above is not limited the above embodiments, and any modifications made in a range without deviating from the gist of the present invention are also included in the present invention.

In addition to the above description, the following is described.

A method of manufacturing a semiconductor device, is achieved by forming first and second lower layer interconnections on a substrate; by forming an interlayer insulating film on the first and second lower layer interconnections and the substrate; by forming first and second via holes to pass through the interlayer insulating film to the first and second lower layer interconnections, respectively; and by forming first and second upper interconnections on the interlayer insulating film to fill the first and second via holes, respectively. An interconnection via and a via-type electric fuse are formed from the filled first and second via holes, and a sectional area of the fuse is smaller than that of the second upper layer interconnection, and smaller than that of the interconnection via.

In the above, the sectional area of the second upper layer interconnection is equal to or larger than 1.8 times the sectional area of the fuse.

In the above, the sectional area of the interconnection via is equal to or larger than 1.8 times the sectional area of the fuse.

What is claimed is:

1. A semiconductor device comprising:
   a lower layer interconnection formed on a chip;
   an upper layer interconnection formed in an upper layer above said lower layer interconnection above said chip;
   an interconnection via formed to electrically connect said lower layer interconnection and said upper layer interconnection;
   a via-type electric fuse formed to electrically connect said lower layer interconnection and said upper layer interconnection, wherein said fuse is cut through heat generation,
   wherein a sectional area of said fuse is smaller than a sectional area of said upper layer interconnection and a via diameter of said fuse is smaller than that of said interconnection via.

2. The semiconductor device according to claim 1, wherein the sectional area of said upper layer interconnection is equal to or more than 1.8 times the sectional area of said fuse.

3. The semiconductor device according to claim 1, further comprising:
   a non-volatile memory which comprises said fuse and said interconnection via.

4. The semiconductor device according to claim 2, wherein the via diameter of said interconnection via is equal to or more than 1.8 times the via diameter of said fuse.

* * * * *